(12) United States Patent
Inoue et al.

(10) Patent No.: US 8,480,843 B2
(45) Date of Patent: Jul. 9, 2013

(54) PROTECTIVE FILM

(75) Inventors: Tsuyoshi Inoue, Ibaraki (JP); Kazuhito Okumura, Ibaraki (JP); Hiroshi Yada, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 637 days.

(21) Appl. No.: 11/750,607

(22) Filed: May 18, 2007

(65) Prior Publication Data

US 2007/0215275 A1     Sep. 20, 2007

Related U.S. Application Data

(63) Continuation of application No. 10/453,497, filed on Jun. 4, 2003, now abandoned.

(30) Foreign Application Priority Data

Jun. 27, 2002 (JP) .................... 2002-187077

(51) Int. Cl.
*C04B 37/00* (2006.01)
*B32B 7/12* (2006.01)
*B32B 15/04* (2006.01)

(52) U.S. Cl.
USPC ........... 156/325; 428/343; 428/353; 428/354; 428/356

(58) Field of Classification Search
USPC .......................... 156/325; 428/343, 353–356
See application file for complete search history.

(56) References Cited

U.S. PATENT DOCUMENTS

| | | | |
|---|---|---|---|
| 4,599,265 A | | 7/1986 | Esmay |
| 4,988,550 A | | 1/1991 | Keyser et al. |
| 5,187,007 A | | 2/1993 | Ebe et al. |
| 5,347,766 A | * | 9/1994 | Komatsu et al. .............. 451/29 |
| 5,571,617 A | | 11/1996 | Cooprider et al. |
| 5,648,425 A | | 7/1997 | Everaerts et al. |
| 6,248,393 B1 | | 6/2001 | Bunyan et al. |
| 6,410,137 B1 | | 6/2002 | Bunyan |
| 6,509,076 B1 | * | 1/2003 | Otaki et al. .................. 428/40.1 |

FOREIGN PATENT DOCUMENTS

| | | |
|---|---|---|
| EP | 0 544 933 A1 | 6/1993 |
| EP | 0 878 527 A1 | 11/1998 |
| EP | 1 108 770 A2 | 6/2001 |
| JP | 11-256111 A | 9/1999 |

OTHER PUBLICATIONS

Patent Abstracts of Japan, 01 144488, vol. 013, No. 402 (1989).
Patent Abstracts of Japan, 2001 049206, vol. 2000, No. 19 (2001).
European Search Report dated Sep. 16, 2003.
U.S. Final Office Action dated Aug. 29, 2012 issued in U.S. Appl. No. 11/782,397.
Communication dated Jul. 14, 2009 issued by the United States Patent and Trademark Office in U.S. Appl. No. 11/782,397.
Communication dated Jan. 11, 2010 issued by the United States Patent and Trademark Office in U.S. Appl. No. 11/782,397.
Communication dated May 27, 2010 issued by the United States Patent and Trademark Office in U.S. Appl. No. 11/782,397.
Communication dated Oct. 5, 2010 issued by the United States Patent and Trademark Office in U.S. Appl. No. 11/782,397.
Communication dated Mar. 24, 2011 issued by the United States Patent and Trademark Office in U.S. Appl. No. 11/782,397.
Communication dated Jul. 13, 2011 issued by the United States Patent and Trademark Office in U.S. Appl. No. 11/782,397.
Communication dated May 9, 2012 issued by the United States Patent and Trademark Office in U.S. Appl. No. 11/782,397.
Yokoyama, S: "Electromagnetic shielding sheet for electronic displays, has mesh-like electromagnetic shielding material which is laminated on transparent film through adhesive film", Abstract of JP 2002-043789 A, published Feb. 8, 2002.
Inoue, Takeshi, et al: "Protective Film", Abstract of JP 2004-027070 A, published Jan. 29, 2004.
Communication dated Nov. 13, 2012 from the Japanese Patent Office in counterpart Japanese application No. 2010-030361.

* cited by examiner

*Primary Examiner* — Michael Orlando
(74) *Attorney, Agent, or Firm* — Sughrue Mion, PLLC

(57) ABSTRACT

A process for protecting a surface of a metal layer or a metal oxide layer including providing a protective film containing a base material and a pressure-sensitive adhesive layer formed thereon, wherein the surface of the pressure-sensitive adhesive layer has a contact angle with methylene iodide as measured just after contact, $\theta_1$, of 70° or smaller and a change in contact angle with methylene iodide through 30-second standing, $\Delta\theta$, of 8% or less.

4 Claims, No Drawings

PROTECTIVE FILM

This is a continuation of application Ser. No. 10/453,497 filed Jun. 4, 2003; the entire disclosure of which is considered part of the disclosure of the accompanying continuation application and is hereby incorporated by reference.

FIELD OF THE INVENTION

The present invention relates to a protective film with which the metal layers or metal oxide layers used as electromagnetic shielding materials or the like can be kept in a satisfactory state without undergoing fouling or the like.

BACKGROUND OF THE INVENTION

In plasma display panels (PDPs), CRTs, and the like, electromagnetic shielding is highly important for preventing electromagnetic noises. In one technique for electromagnetic shielding, a metal such as gold or silver or a metal oxide such as ITO is used as an electromagnetic shielding material for these apparatus to form a thin conductive layer or mesh pattern by vapor deposition or the like. Such metal layers or metal oxide layers are generally kept being protected with a protective film until use.

However, when general protective films are used, the surfaces of those metal layers or metal oxide layers are apt to be fouled probably because these surfaces are especially active. There have been cases where this fouling impairs the function of electromagnetic shields.

SUMMARY OF THE INVENTION

Accordingly, an object of the invention is to provide a protective film with which the metal layers and metal oxide layers used as electromagnetic shields or the like can be kept in a satisfactory state without undergoing fouling or the like.

The present inventors have found through intensive investigations that the fouling which occurs on the surfaces of metal layers or metal oxide layers is considerably influenced by the surfaces of the pressure-sensitive adhesive layers. Specifically, it has been found that when a protective film comprising a base material and formed thereon a pressure-sensitive adhesive layer whose surface has a contact angle with methylene iodide ($CH_2I_2$) as measured just after contact, $\theta_1$, of 70° or smaller, preferably from 50 to 70°, and a change in contact angle with methylene iodide through 30-second standing, $\Delta\theta$, is 8% or less, preferably 6% or less, is used, then the surface of the metal layer or metal oxide layer can be prevented from being fouled and can retain a satisfactory state. The invention has thus been achieved.

The invention provides a protective film comprising a base material and a pressure-sensitive adhesive layer formed thereon, wherein the surface of the pressure-sensitive adhesive layer has a contact angle with methylene iodide as measured just after contact, $\theta_1$, of 70° or smaller and a change in contact angle with methylene iodide through 30-second standing, $\Delta\theta$, of 8% or less.

The change in contact angle through 30-second standing, $\Delta\theta$, can be determined using the following equation. Values of contact angle are obtained through measurements with a commercial contact angle meter at 23° C. by the $\theta/2$ method.

$$\Delta\theta = |\theta_1 - \theta_2| \times 100 / \theta_1$$

$\Delta\theta$: change in contact angle through 30-second standing (%)

$\theta_1$: contact angle with methylene iodide as measured just after contact (°)

$\theta_2$: contact angle with methylene iodide as measured at 30 seconds after contact (°)

In case where the value of $\theta_1$ exceeds 70° or $\Delta\theta$ exceeds 8%, fouling is apt to occur probably because such a pressure-sensitive adhesive layer surface shows enhanced bonding to the metal layer or metal oxide layer surface.

In this protective film, the main polymer of the pressure-sensitive adhesive layer preferably is a (meth)acrylic polymer. The protective film of the invention is preferably used for the surface protection of an electromagnetic shielding material.

DETAILED DESCRIPTION OF THE INVENTION

The protective film of the invention comprises a base material and a pressure-sensitive adhesive layer formed thereon. The protective film may have an interlayer such as, e.g., a primer layer between the base material and the adhesive layer. The pressure-sensitive adhesive layer may be made of any material as long as the requirements concerning contact angle and change in contact angle are satisfied. Namely, the contact angle between the surface of the pressure-sensitive adhesive layer in the protective film of the invention and methylene iodide as measured just after contact, $\theta_1$, is 70° or smaller, preferably from 50 to 70°, and the change in contact angle between the surface and methylene iodide through 30-second standing, $\Delta\theta$, is 8% or less, preferably 6% or less.

The main polymer of the pressure-sensitive adhesive layer preferably is a (meth)acrylic polymer from the standpoint of obtaining a balance between adhesive properties and suitability for peeling. The (meth)acrylic polymer used here is a polymer obtained by the homopolymerization or copolymerization of one or more monomers such as, e.g., (meth)acrylic esters having an alkyl group having 1 to 18 carbon atoms optionally together with one or more copolymerizable modifying monomers by an appropriate technique such as, e.g., solution polymerization or emulsion polymerization.

Examples of the (meth)acrylic esters and copolymerizable modifying monomers include (meth)acrylic esters having an alkyl group such as butyl, 2-ethylhexyl, isooctyl, isononyl, ethyl, or methyl and modifying monomers such as (meth) acrylonitrile, vinyl acetate, styrene, (meth)acrylic acid, maleic anhydride, vinylpyrrolidone, (meth)acrylic esters having a glycidyl group, dimethylaminoethyl group, or hydroxyl group, (meth)acrylamide, vinylamine, allylamine, and ethyleneimine. The term "(meth)acrylic" as used herein refers to "acrylic and/or methacrylic"; the term "(meth)actylonitrile" as used herein refers to "acrylonitrile and/or methacrylonitrile"; and the term "(meth)acrylate" as used herein refers to "acrylate and/or methacrylate".

Although the (meth)acrylic polymer by itself may be used as the base polymer of the pressure-sensitive adhesive, a crosslinking agent is usually incorporated into the polymer before use for the purpose of improving the cohesive force of the pressure-sensitive adhesive. A crosslinked structure can be imparted to an acrylic polymer by adding a polyfunctional (meth)acrylate or the like as an internal crosslinking agent when the acrylic polymer is synthesized or by adding a polyfunctional epoxy or isocyanate compound or the like as an external crosslinking agent after the acrylic polymer has been synthesized. Besides these, a crosslinking treatment with exposure to a radiation may be used. Preferred of these techniques for forming a crosslinked structure is the method in which a polyfunctional epoxy compound or a polyfunctional isocyanate compound is incorporated as an external crosslinking agent.

The term "polyfunctional" as used herein means to have a functionality of 2 or higher. Examples of the polyfunctional epoxy compound include various compounds having two or more epoxy groups in the molecule. Typical examples thereof include sorbitol tetraglycidyl ether, trimethylolpropane glycidyl ether, tetraglycidyl-1,3-bisaminomethylcyclohexane, tetraglycidyl-m-xylenediamine, and triglycidyl-p-aminophenol. Examples of the polyfunctional isocyanate compound include various compounds having two or more isocyanate groups in the molecule. Typical examples thereof include diphenylmethane diisocyanate, tolylene diisocyanate, and hexamethylene diisocyanate.

Those crosslinking agents can be used alone or in combination of two or more thereof. The amount of the crosslinking agents to be used can be suitably selected according to the composition and molecular weight of the (meth)acrylic polymer, etc. A crosslinking catalyst in general use for pressure-sensitive adhesives, such as, e.g., dibutyltin laurate, may be added in order to accelerate the reaction. Furthermore, ordinary additives may be incorporated into the pressure-sensitive adhesive according to need.

It is preferred to minimize the incorporation of additives in forming a pressure-sensitive adhesive layer. However, suitable additives can be incorporated according to need for the purpose of, e.g., regulating pressure-sensitive adhesive properties. Examples thereof include softeners, silicone polymers, acrylic copolymers, tackifiers, antioxidants, hindered-amine light stabilizers, ultraviolet absorbers, and fillers or pigments such as calcium oxide, magnesium oxide, silica, zinc oxide, and titanium oxide. However, such additives preferably are ones which cause no damage to the adherend.

In the invention, it is preferred to take the following measures in order to satisfy the above-described requirements concerning contact angel and change thereof. For attaining a reduced contact angle, it is preferred to minimize the amount of units derived from short-side-chain acrylic monomers (e.g., acrylic monomers having a side chain having not more than 2 carbon atoms) in the (meth)acrylic polymer as long as the properties of the polymer are not impaired thereby. For attaining a reduced change in contact angle, it is preferred to minimize the amount of additives such as low-molecular plasticizers.

The base material preferably is a thermoplastic film made of a single polyolefin such as, e.g., polyethylene or polypropylene, a mixture of two or more such polyolefins, or another polymer such as a nylon, PET, polyimide, polycarbonate, or PTFE. From the standpoints of transparency, fish-eye diminution, etc., a PET film is preferred. Although the thickness of the base material is generally from 5 to 200 μm, preferably from 20 to 100 μm, it is not limited to these values.

The protective film can be formed by known techniques for adhesive-sheet formation. For example, use may be made of: a method in which either a solution of a material for pressure-sensitive adhesive layer formation in a solvent or a melt of the material is applied to a base material; a method in which a pressure-sensitive adhesive layer formed on a release liner by applying the solution or melt is transferred to a base material; a method in which a material for pressure-sensitive adhesive layer formation is applied to a base material by extrusion coating; or a method in which a pressure-sensitive adhesive layer is laminated to a base material. Although the thickness of the pressure-sensitive adhesive layer to be formed may be suitably determined, it is generally 100 μm or smaller, preferably from 1 to 50 μm, especially preferably from 1 to 40 μm. Until the protective film is put to practical use, the pressure-sensitive adhesive is kept being protective according to need by provisionally applying a release liner or the like thereto.

The protective film of the invention is suitable for use in the surface protection of the metal layer or metal oxide layer of an electromagnetic shielding material, transparent conductive film, sheet coated with a vapor-deposited metal, or the like. Especially preferably, it is used for the surface protection of an electromagnetic shielding material.

The constitution and effect of the invention will be explained below by reference to Examples thereof, etc.

Example 1

A 20% toluene solution of an acrylic polymer formed from 2-ethylhexyl acrylate (70 parts (parts by weight; the same applies hereinafter)), N-acryloylmorpholine (30 parts), and acrylic acid (3 parts) was prepared by an ordinary method. To this solution were added 2 parts of an epoxy crosslinking agent (Tetrad C, manufactured by Mitsubishi Gas Chemical Co., Inc.) and 2 parts of an isocyanate crosslinking agent (Coronate L, manufactured by Nippon Polyurethane Co., Ltd.) per 100 parts of the acrylic polymer. The resultant composition was applied to a 38-μm PET film in a thickness of 5 μm on a dry basis, and the coating was dried. Thus, a protective film was obtained, which had a $\theta_1$ of 56.5° and a $\Delta\theta$ of 1.7%.

Example 2

A 20% toluene solution of an acrylic polymer formed from 2-ethylhexyl acrylate (55 parts), vinyl acetate (45 parts), and acrylic acid (3 parts) was prepared by an ordinary method. To this solution was added 2 parts of an epoxy crosslinking agent (Tetrad C, manufactured by Mitsubishi Gas Chemical Co., Inc.) per 100 parts of the acrylic polymer. The resultant composition was applied to a 38-μm PET film in a thickness of 5 μm on a dry basis, and the coating was dried, Thus, a protective film was obtained, which had a $\theta_1$ of 58.3° and a $\Delta\theta$ of 1.2%.

Example 3

A 20% toluene solution of an acrylic polymer formed from 2-ethylhexyl acrylate (100 parts) and hydroxyethyl acrylate (4 parts) was prepared by an ordinary method. To this solution were added 3.5 parts of an isocyanate crosslinking agent (Coronate L, manufactured by Nippon Polyurethane Co., Ltd.) and 0.05 part of a reaction catalyst (OL-1, manufactured by Tokyo Fine Chemical Co., Ltd.) per 100 parts of the acrylic polymer. The resultant composition was applied to a 38-μm PET film in a thickness of 20 μm on a dry basis, and the coating was dried. Thus, a protective film was obtained, which had a $\theta_1$ of 62.8° and a $\Delta\theta$ of 3.9%.

Example 4

A 20% toluene solution of an acrylic polymer formed from 2-ethylhexyl acrylate (50 parts), butyl methacrylate (50 parts), acrylic acid (0.5 part), and hydroxyethyl acrylate (2 parts) was prepared by an ordinary method. To this solution were added 3 parts of an isocyanate crosslinking agent (Coronate L, manufactured by Nippon Polyurethane Co., Ltd.) and 0.1 part of a reaction catalyst (OL-1, manufactured by Tokyo Fine Chemical Co., Ltd.) per 100 parts of the acrylic polymer. The resultant composition was applied to a 38-μm PET film in a thickness of 5 μm on a dry basis, and the coating was dried. Thus, a protective film was obtained, which had a $\theta_1$ of 59.1° and a $\Delta\theta$ of 5.1%.

Comparative Example 1

A 20% toluene solution of an acrylic polymer formed from 2-ethylhexyl acrylate (50 parts), methyl acrylate (50 parts), and acrylic acid (2 parts) was prepared by an ordinary method. To this solution were added 3.5 parts of an isocyanate crosslinking agent (Coronate L, manufactured by Nippon Polyurethane Co., Ltd.), 0.05 part of a reaction catalyst (OL-1, manufactured by Tokyo Fine Chemical Co., Ltd.), and 15 parts of a plasticizer (dibutoxyethoxyethyl adipate) per 100 parts of the acrylic polymer. The resultant composition was applied to a 38-μm PET film in a thickness of 20 μm on a dry basis, and the coating was dried. Thus, a protective film was obtained, which had a $\theta_1$ of 72.9° and a $\Delta\theta$ of 10.0%.

Comparative Example 2

The same procedure as in Comparative Example 1 was conducted, except that the plasticizer was omitted. Thus, a protective film was obtained, which had a $\theta_1$ of 73.5° and a $\Delta\theta$ of 3.8%.

Comparative Example 3

The same procedure as in Example 3 was conducted, except that 15 parts of a plasticizer (dibutoxyethoxyothyl adipate) was added. Thus, a protective film was obtained, which had a $\theta_1$ of 61.5° and a $\Delta\theta$ of 8.8%.

The protective films obtained in the Examples and Comparative Examples were aged at 40° C. for 3 days.
Evaluation Method Each of the protective films obtained in the Examples and Comparative Examples was applied to an ITO-coated film by press-bonding the protective film to the ITO side of the adherend with a laminator at a linear pressure of 78 N/cm. The protective films applied were allowed to stand at 80° C. for 72 hours and then peeled off. Thereafter, the ITO-coated films were held to the light from a green lamp to visually examine the films for fouling. The results of this evaluation are shown in the following tables.

TABLE 1

|  | Example 1 | Example 2 | Example 3 | Example 4 |
|---|---|---|---|---|
| $\theta_1$ (°) | 56.5 | 58.3 | 62.8 | 59.1 |
| $\Delta\theta$ (%) | 1.7 | 1.2 | 3.9 | 5.1 |
| Fouling | not occurred | not occurred | not occurred | not occurred |

TABLE 2

|  | Comparative Example 1 | Comparative Example 2 | Comparative Example 3 |
|---|---|---|---|
| $\theta_1$ (°) | 72.9 | 73.5 | 61.5 |
| $\Delta\theta$ (%) | 10.0 | 3.8 | 8.8 |
| Fouling | occurred | occurred | occurred |

The results given in Tables 1 and 2 show that the protective films of the Examples caused no fouling and were highly satisfactory, whereas the protective films of the Comparative Examples caused fouling.

While the invention has been described in detail and with reference to specific embodiments thereof, it will be apparent to one skilled in the art that various changes and modifications can be made therein without departing from the spirit and scope thereof.

What is claimed is:

1. A process for protecting a surface of a metal layer or a metal oxide layer comprising:
    providing a metal layer or a metal oxide layer,
    providing a protective film comprising a base material and a pressure-sensitive adhesive layer formed thereon,
    applying the protective film on the metal layer or the metal oxide layer via the pressure-sensitive adhesive layer, and
    removing the protective film from the metal layer or the metal oxide layer,
    wherein the pressure-sensitive adhesive layer comprises a (meth)acrylic polymer and a crosslinking agent, and the crosslinking agent comprises a polyfunctional epoxy compound or a polyfunctional isocyanate compound,
    wherein the surface of the pressure-sensitive adhesive layer has a contact angle with methylene iodide as measured just after contact, $\theta_1$, of 70° or smaller and a change in contact angle with methylene iodide through 30-second standing, $\Delta\theta$, of 8% or less, and wherein the pressure-sensitive adhesive layer has a thickness of 20 μm or less, and
    wherein the (meth)acrylic polymer is a polymer obtained by the copolymerization of one or more (meth)acrylic esters having an alkyl group having 1 to 18 carbon atoms and one or more copolymerizable modifying monomers selected from the group consisting of (meth)acrylonitrile, vinyl acetate, styrene, maleic anhydride, vinylpyrrolidone, (meth)acrylic esters having a glycidyl group, a dimethylaminoethyl group, or a hydroxyl group, (meth)acrylamide, vinylamine, allylamine, and ethyleneimine.

2. The process of claim 1, wherein the (meth)acrylic polymer is a polymer obtained by solution polymerization or emulsion polymerization.

3. The process of claim 2, wherein the (meth)acrylic ester is selected from the group consisting of (meth)acrylic esters having a butyl group, a 2-ethylhexyl group, an isooctyl group, an isononyl group, an ethyl group, or a methyl group.

4. The process of claim 2, wherein the (meth)acrylic polymer is a polymer obtained by the copolymerization of the one or more (meth)acrylic esters having an alkyl group having 1 to 18 carbon atoms, the one or more copolymerizable modifying monomers, and (meth)acrylic acid.

* * * * *